US011008482B2

(12) United States Patent
So et al.

(10) Patent No.: US 11,008,482 B2
(45) Date of Patent: May 18, 2021

(54) POLISHING COMPOSITION AND POLISHING METHOD USING THE SAME

(71) Applicant: SOULBRAIN CO., LTD., Seongnam-si (KR)

(72) Inventors: Hye Kyung So, Seongnam-si (KR); Myeong Hoon Han, Seongnam-si (KR)

(*) Notice: Subject to any disclaimer, the term of this patent is extended or adjusted under 35 U.S.C. 154(b) by 0 days.

(21) Appl. No.: 16/226,666

(22) Filed: Dec. 20, 2018

(65) Prior Publication Data
US 2020/0165487 A1 May 28, 2020

(30) Foreign Application Priority Data

Nov. 23, 2018 (KR) .................. 10-2018-0146650

(51) Int. Cl.
*C09G 1/04* (2006.01)
*H01L 21/3105* (2006.01)
*C23F 1/10* (2006.01)
*H01L 21/321* (2006.01)

(52) U.S. Cl.
CPC .......... *C09G 1/04* (2013.01); *H01L 21/31053* (2013.01); *C23F 1/10* (2013.01); *H01L 21/3212* (2013.01)

(58) Field of Classification Search
CPC .... C09G 1/04; C09G 1/00; C09G 1/02; H01L 21/31053; H01L 21/3212; H01L 21/30625; H01L 21/32115; C23F 1/10
USPC .... 252/79.1, 79.2, 79.3, 79.4; 438/691, 692, 438/693, 694
See application file for complete search history.

(56) References Cited

U.S. PATENT DOCUMENTS

| 6,653,267 | B2* | 11/2003 | Yano | C09G 1/02 |
| | | | | 257/E21.304 |
| 2004/0060502 | A1* | 4/2004 | Singh | C09G 1/02 |
| | | | | 117/68 |
| 2004/0106697 | A1* | 6/2004 | Lortz | C09C 1/3054 |
| | | | | 523/160 |
| 2007/0190789 | A1* | 8/2007 | Carter | H01L 31/1884 |
| | | | | 438/692 |
| 2010/0096584 | A1* | 4/2010 | Saeki | C09G 1/02 |
| | | | | 252/79.2 |
| 2015/0376018 | A1* | 12/2015 | Suemura | B82Y 30/00 |
| | | | | 423/335 |
| 2016/0153095 | A1* | 6/2016 | Yoshizaki | C23F 3/04 |
| | | | | 252/79.2 |
| 2017/0348820 | A1* | 12/2017 | Zhang | B24B 37/044 |
| 2019/0106596 | A1* | 4/2019 | Mishra | C09G 1/02 |

* cited by examiner

*Primary Examiner* — Lan Vinh
(74) *Attorney, Agent, or Firm* — Jongkook Park

(57) ABSTRACT

The present invention relates to a polishing composition, and more particularly, to a chemical mechanical polishing (CMP) composition used to chemically and mechanically polish a semiconductor wafer. The polishing composition of the present invention, by comprising anion-modified silica polishing particles in which the zeta potential ($\zeta$) is $\leq -10$ mV, can exhibit excellent polishing performance, and more specifically, which can achieve a high polishing rate with respect to an indium-containing polishing substrate, while improving the dispersibility of the composition and reducing residual defects on the substrate.

12 Claims, No Drawings

POLISHING COMPOSITION AND POLISHING METHOD USING THE SAME

CROSS-REFERENCE TO RELATED APPLICATIONS

This application claims priority under 35 U.S.C. § 119 to Korean Patent Application No. 10-2018-0146650, filed on Nov. 23, 2018, in the Korean Intellectual Property Office, the disclosure of which is incorporated herein by reference in its entirety.

TECHNICAL FIELD

The following disclosure relates to a polishing composition, and more particularly, to a chemical mechanical polishing (CMP) composition used to chemically and mechanically polish a semiconductor wafer.

BACKGROUND

The term integrated circuit refers to a functional device having a complete circuit function formed in a structure in which a plurality of active devices and passive devices are microminiaturized and integrated into a single semiconductor substrate so that the devices cannot be separated. The structure of such a device is generally formed of various kinds of metal layers, intermediate connection layers, insulating films, and the like. Among them, interlayer dielectric such as doped silicon dioxide ($SiO_2$) and undoped $SiO_2$ are used to electrically isolate a silicon substrate or various metal layers.

A wiring process, which is one of the manufacturing processes of a semiconductor element, comprises a step of embedding a metal material such as tungsten, copper, aluminum, or the like, in a groove formed on an insulating layer to deposit a metal layer on the groove portion. In addition, chemical mechanical polishing (CMP) is used to etch unnecessary portions of the metal layer.

In the chemical mechanical polishing process, a substrate is in contact with a polishing pad, and the polishing process is performed in a manner in which pressure is applied to the polishing pad. The pressure on the surface of the substrate which is in contact with the polishing pad is maintained while the polishing pad and a table are rotated. A polishing composition is adsorbed between the pad and the substrate during the polishing process. The composition chemically interacts with the film being polished to perform the polishing process. The polishing process is achieved through rotational movement of the pad with respect to the substrate when the slurry is fed to an interface between a wafer and the pad. The polishing is continuously performed in this manner until a desired film on the substrate is removed.

Recently, following the high integration and high performance of semiconductor elements, there is a trend in which the line width of wiring patterns is becoming finer and highly multilayered, so that the interlayer flatness in each process is becoming more important in order to achieve improvement of the precision of the polishing process. In order to improve the interlayer flatness, the chemical mechanical polishing process is considered to be becoming even more important. The interlayer flatness is known to be affected not only by the removal rate of each layer, but also by having a high selectivity with respect to the material to be removed, dishing, and loss.

In order to achieve excellent flatness and few defects, polishing particles are required to have appropriate hardness, size and shape. The types of and total number of scratches on a substrate surface may be affected by the type, size, and distribution of the particles. Further, defects on the polishing surface may also be affected by the formation of a stable dispersion of polishing particles in a composition.

In order to provide a polishing composition having excellent performance, efforts have been made to replace polishing particles obtained by conventional synthetic methods with high-purity polishing particles obtained by the Teos synthesis method. However, in this case, the unit cost of raw materials of the composition increases, which causes an increase in the cost of the entire process.

Therefore, there is an urgent need to develop a polishing composition which is excellent in view of the polishing rate, defects, and dispersibility, even without use of a high-purity polishing agent.

SUMMARY

An embodiment of the present disclosure is directed to providing a composition capable of improving the polishing rate of a conventional chemical mechanical polishing (CMP) composition, and more specifically, a polishing composition capable of improving the polishing performance with respect to an indium-containing polishing substrate.

To achieve the above-mentioned object, the present invention provides a polishing composition comprising anion-modified silica polishing particles in which the zeta potential ($\zeta$) is $-10$ mV. In addition, the present invention is provides a polishing method comprising application of the polishing composition according to the present invention to a polishing substrate.

DETAILED DESCRIPTION OF EMBODIMENTS

In one aspect, the present disclosure provides a polishing composition comprising anion-modified silica polishing particles in which the zeta potential ($\zeta$) is $\leq -10$ mV.

The polishing composition of the present disclosure comprises anion-modified silica polishing particles in which the zeta potential ($\zeta$) is $\leq -10$ mV. By using silica polishing particles having a negative surface charge in the polishing composition, it is possible to improve their dispersibility in the polishing composition, more specifically, to improve their dispersibility in an acidic polishing composition. In the present invention, the silica polishing particles, particularly, the silica polishing particles that are anionically modified to have a zeta potential ($\zeta$) of $\leq -10$ mV, may be used to significantly improve the dispersibility of the composition.

In the present disclosure, the silica polishing particles are polishing particles that are used in a polishing composition and which comprise silicon atoms and oxygen atoms. In the present disclosure, the term "surface modified" silica polishing particles may mean that at least some of the silicon atoms of the silica polishing particles are substituted with a substitution metal.

More specifically, in view of the dispersibility and polishing performance, the substitution metal may more preferably comprise aluminum.

In the present disclosure, the anion-modified silica polishing particles may be produced by, for example, mixing the silica polishing particles with a precursor compound of the substitution metal, heat treatment, or the like, but the production of the anion-modified silica polishing particles is not limited thereto.

The precursor of the substitution metal may be one or more selected from the group consisting of metal oxides, organic metals, and metal salts of the substitution metal.

The metal oxide may comprise, for example, $Al_2O_3$, but it is not limited thereto.

The organic metal may be a compound including a chemical bond between a metal and carbon, and the substitution metal may be provided in an anion form using any organometallic compound of the substitution metal.

The metal salt may comprise, for example, $Al(OH)_4^-$, but it is not limited thereto.

Since $Al(OH)_4^-$ used in the above example as the precursor of the substitution metal is geometrically similar to $Si(OH)_4$, the substitution metal may be incorporated into silica and substituted at the $Si(OH)_4$ position therein, thereby resulting in the formation of anion-modified silica polishing particles.

The substitution metal may be included in an amount of 0.001 to 10% by weight, and more specifically, 0.3 to 2.5% by weight based on the total weight of the anion-modified silica polishing particles. When the substitution metal is included within the above-described range, the polishing performance, such as the polishing rate and the degree of defects, may be further improved.

In an embodiment of the present invention, the anion-modified silica polishing particles may be aluminum-modified silica polishing particles produced by mixing silica polishing particles with $Al(OH)_4—$, wherein the $Al(OH)_4—$ may be mixed in an amount of 0.001 to 10% by weight, and more specifically, 0.3 to 2.5% by weight, based on the total weight of the aluminum-modified silica polishing particles, thereby providing a polishing composition capable of exhibiting a high polishing rate.

The silica polishing particles may be colloidal silica, fumed silica or a mixture thereof, but in consideration of improvement of the dispersibility of the polishing composition, colloidal silica polishing particles are preferable. The colloidal silica may be produced by any conventional method known in the art or any commercially available method, but the method is not particularly limited.

Further, the anion-modified silica polishing particles may have an average particle size ($D_{50}$) of 10 to 200 nm, specifically 30 to 150 nm, and more specifically 40 to 100 nm. By using anion-modified silica polishing particles within the above-described range, it is possible to provide a polishing composition that exhibits better performance in view of improvement of the dispersibility of the composition and improvement of scratches during polishing. More specifically, the degree of defects may be remarkably improved while maintaining the polishing rate with respect to an indium-containing polishing substrate at an excellent level. For example, when the average particle size is lower than the above-described range, the polishing rate is lowered, which is inefficient in view of productivity. When the average particle size exceeds the above-described range, dispersion of the particles is difficult, and a large amount of scratches may occur on the surface to be polished.

The amount of the anion-modified silica polishing particles may be 0.01 to 50% by weight, and specifically 0.1 to 30% by weight based on the total weight of the polishing composition, but it is not limited thereto. Including the anion-modified silica polishing particles within the above-described range may be preferable in view of achieving excellent polishing performance and dispersibility.

In addition, the pH of the polishing composition according to the present disclosure may be 2 to 8, and specifically 4 to 6. In an embodiment, the polishing rate may be adjusted depending on the pH of the composition, and in particular, it was confirmed that that the polishing rate with respect to an indium-containing polishing substrate may be improved remarkably when the pH of the polishing composition is in the above-described range. For example, when the pH is lower than the above-described range, it may cause corrosion of equipment, and the like, and the stability of the anion-modified particles may be deteriorated. When the pH exceeds the above-described range, the stability of the particles may be deteriorated, or polishing performance may not be sufficiently exhibited.

In order to adjust the pH of the polishing composition, the polishing composition may further comprise any pH adjuster known in the art within the range in which the objects of the present disclosure are not impaired. The pH adjuster may comprise, but is not limited to, inorganic acids such as sodium hydroxide, potassium hydroxide, ammonium hydroxide, sodium carbonate, potassium carbonate, nitric acid, sulfuric acid, hydrochloric acid, phosphoric acid, mixtures thereof, or salts thereof; or organic acids such as acetic acid, succinic acid, maleic acid, citric acid, oxalic acid, lactic acid, tartaric acid, mixtures thereof, or salts thereof. The pH adjuster may be included in an amount of, for example, 0.01 to 10% by weight, 0.1 to 5% by weight, or 0.1 to 1% by weight, based on the total weight of the polishing composition.

Further, the anion-modified silica polishing particles may further comprise a compound capable of forming a stable anion by hydrolysis on a surface thereof so that the surface is further modified. For example, the anion-modified silica polishing particles may further comprise a compound formed on the surface by hydrolysis of at least one compound selected from the group consisting of polycarbonate, polysiloxane, polysulfide, polyepoxide, and polyketone, so that the surface is further modified.

The surface of the anion-modified silica polishing particles comprises an anionic carboxylate group (RCOO—) achieved by adhering a polycarbonate on the surface of the anion-modified silica polishing particles and performing hydrolysis, and thus the surface may be further modified with anions so that the zeta potential may be modified to have an even more negative value.

More specifically, the zeta potential ($\zeta$) of the anion-modified silica polishing particles may be modified to be $\zeta \leq -25$ mV, and thus the dispersibility of the polishing composition may be improved, thereby achieving improvement of the polishing rate and significant improvement in the degree of scratch occurrence, as well as significant improvement in the stability of the composition due to electrostatic attraction and repulsion between particles in the composition.

The polishing composition of the present disclosure may further comprise one or more conventional additives used in a polishing composition of the related art, such as a complexing agent, a corrosion inhibitor, a biocide, and the like, within a range in which the objects of the present disclosure are not impaired.

The complexing agent may be used to improve the rate of removal of the substrate layer to be removed, and may comprise, for example, one or more selected from the group consisting of carbonyl compounds, carboxylic acid compounds, alcohols, amine-containing compounds, and salts thereof, but it is not limited thereto.

The complexing agent may comprise, for example, acetylacetonate, acetic acid, arylcarboxylic acid, glycolic acid, lactic acid, gluconic acid, gallic acid, citric acid, succinic acid, tartaric acid, oxalic acid, phthalic acid, malic acid, EDTA, sulfonic acid, phosphonic acid, pyrocatechol, pyrogallol, tannic acid, a salt thereof, or a mixture thereof, but it is not limited thereto.

The complexing agent may be determined depending on the type of substrate to be removed. The salts of the above-described compounds may be, for example, a metal salt, an ammonium salt, and the like, and may be present in the form of acids or partial salts. For example, the citric acid may comprise a mono-, di-, tri-salt of citric acid. The complexing agent may be included in an amount of 0.01 to 10% by weight, for example, 0.1 to 5% by weight, or 0.1 to 1% by weight, based on the total weight of the composition.

In addition, the corrosion inhibitor may serve as a polishing regulator in which polishing may be adjusted by inhibiting corrosion in a low step region where physical polishing does not occur and removing the layer in a high step region where polishing takes place by physical action of the polishing agent. The corrosion inhibitor may comprise, for example, ammonia, alkylamine, amino acid, imine, an azole compound, or a mixture thereof, but it is not limited thereto. The corrosion inhibitor may be included in an amount of 0.01 to 5% by weight, or, for example, 0.005 to 1% by weight, based on the total weight of the composition, thereby exhibiting inhibition of corrosion of the low step region, excellent polishing selectivity, and storage stability of the composition.

In an embodiment, the polishing composition of the present disclosure may exhibit excellent polishing performance with respect to a polishing substrate comprising an indium-containing layer, without inclusion of a substantial amount of a corrosion inhibitor and/or a complexing agent (e.g., in an amount of 5% by weight or less, or 0% (i.e., not included at all) based on the total weight of the composition).

In addition, the biocide is a substance that inhibits the growth of microorganisms such as bacteria and fungi, and the biocide may be used to prevent or reduce microbial contamination of the device. The above-described biocide is not particularly limited, and any biocide conventionally used in the art may be employed. For example, the biocide may be used in an amount of 50 to 1,000 ppm.

In another aspect, the present disclosure may provide a polishing method comprising a step of applying the polishing composition according to the present disclosure to a polishing substrate.

More specifically, in the present disclosure, the polishing substrate may be a metal oxide film, and the metal oxide film may comprise, for example, an oxide of a metal other than silicon, or a mixture thereof. More specifically, the metal oxide may be an oxide of a transition metal or a metal after transition. For example, the metal oxide may be the oxide of the metal selected from the group consisting of aluminum (Al), indium (In), tin (Sn), gallium (Ga), zinc (Zn), hafnium (Hf), zirconium (Zr), titanium (Ti), cadmium (Cd), and a mixture thereof. Preferably, the polishing substrate of the present disclosure may comprise a layer containing indium, and specifically, may comprise an oxide of indium, and more specifically, may comprise indium tin oxide (ITO). The polishing composition according to the present disclosure may exhibit particularly excellent polishing performance with respect to an indium-containing layer.

The step of applying the polishing composition to the polishing substrate may be performed by any means known in the art, and is not particularly limited, but for example, may be performed by one or more selected from a spray coating method, a spin coating method, a tape casting method, a dip coating method, a bar coating method, a physical vapor deposition method, and a chemical vapor deposition method.

In an embodiment, particularly when the polishing method according to the present disclosure is used, the polishing rate of the ITO layer may be 40 Å/min or more, specifically, 70 Å/min or more, or 100 Å/min or more, and even more specifically, 1000 Å/min or more, or 2000 Å/min or more, for example, from 2000 Å/min to 5000 Å/min. Here, the polishing rate may be measured, for example, as the value obtained by dividing the amount of change in thickness of a thin film before and after polishing by the polishing time.

Hereinafter, embodiments of the present disclosure are described in detail to assist in understanding of the present disclosure. However, the following Examples according to the present disclosure may be modified into various embodiments, and should not be interpreted as limiting the scope of the present disclosure. Rather, these embodiments are only provided to more fully describe the present disclosure to a person of ordinary skill in the field in which the present disclosure pertains.

Preparation of Polishing Composition and Evaluation of Polishing Rate

Polishing particles in an amount of 3% by weight were added to distilled water and stirred to prepare a polishing composition. The pH of the composition was adjusted using potassium hydroxide, and the zeta potential was measured by an electrophoresis light scattering method using a Zeta-sizer Nano ZS (manufactured by Malvern Panalytical Ltd.) after the prepared composition was diluted to 1% by weight.

The polishing rate was evaluated by the following method using the prepared polishing composition, and the results thereof are shown in Table 1.

As the polishing substrate, a Si wafer having a 2000 Å thick indium tin oxide surface layer deposited thereon was used. A polishing test was performed using a Poli400 polisher manufactured by G&P Technology and an IC1000 polishing pad manufactured by Rohm and Haas company, wherein the polishing conditions were as follows: a table/head speed of 93/87 rpm; a polishing pressure of 2 psi; a pressure of the retainer ring of 2 psi; a flow rate of 100 ml/min; and a polishing time of 60 seconds.

The polishing rate was calculated by dividing the amount of change in thickness of the thin film before and after polishing by the polishing time. Here, the thickness of the ITO thin film was calculated by measuring the sheet resistance using a four point probe (manufactured by AIT Co., Ltd.), and then converting the measured sheet resistance into a thickness.

Further, in order to compare polishing performance achieved by anion modification, the polishing compositions were prepared using colloidal silica particles or alumina that were not modified with anions as polishing particles (Comparative Examples 1 to 4), or using colloidal silica particles in which at least a portion of the silicon was substituted with aluminum but in which a positive zeta potential was shown (Comparative Example 5), and the polishing rates thereof were evaluated in the same manner as described above. Results thereof are shown in Table 2.

Further, in order to confirm the excellent polishing performance of the polishing composition according to the present disclosure with respect to the ITO polishing substrate, the polishing rates with respect to silicon oxide and the silicon nitride films were evaluated in the same manner as described above. Results thereof are shown in Tables 3 and 4.

TABLE 1

| | Example 1 | Example 2 | Example 3 | Example 4 | Example 5 | Example 6 | Example 7 | Example 8 |
|---|---|---|---|---|---|---|---|---|
| Polishing particles | Al substituted colloidal silica | Al substituted colloidal silica | Al substituted colloidal silica | Al substituted colloidal silica | Al substituted colloidal silica | Al substituted colloidal silica | Al substituted colloidal silica | Al substituted colloidal silica |
| Al Content (wt %) | 0.001 | 0.3 | 2.5 | 10 | 0.3 | 0.3 | 0.3 | 0.3 |
| Zeta Potential | −25 | −30 | −26 | −34 | −25 | −26 | −35 | −36 |
| pH | 6 | 6 | 6 | 6 | 2 | 4 | 8 | 10 |
| ITO Polishing Rate (Å/min.) | 100 | 3684 | 2359 | 70 | 500 | 2223 | 1206 | 40 |

TABLE 2

| | Comparative Example 1 | Comparative Example 2 | Comparative Example 3 | Comparative Example 4 | Comparative Example 5 |
|---|---|---|---|---|---|
| Polishing particles | Colloid Silica | Colloid Silica | Colloid Silica | Alumina | Al substituted colloidal silica |
| Al Content (wt %) | — | — | — | — | 0.3 |
| Zeta Potential | 30 | −33 | −35 | 43 | 40 |
| pH | 6 | 6 | 6 | 6 | 6 |
| ITO Polishing Rate (Å/min.) | 17 | 50 | 10 | 38 | 48 |

TABLE 3

| | Example 1 | Example 2 | Example 3 | Example 4 |
|---|---|---|---|---|
| Silicon Oxide Film Polishing Rate (Å/min.) | 37 | 12 | 22 | 15 |

TABLE 4

| | Example 6 | Example 7 | Example 8 |
|---|---|---|---|
| Silicon Nitride Film Polishing Rate (Å/min.) | 428 | 81 | 25 |

As can be seen from the above-described results, it could be confirmed that the polishing composition prepared using the polishing particles in which the zeta potential was modified to a negative value using the aluminum-substituted colloidal silica had excellent polishing performance.

Further, it was confirmed that when the aluminum content was 0.3 to 2.5% by weight, the polishing performance was improved more significantly, and when the pH of the composition was 2 to 8, and particularly, 4 to 6, the polishing performance could be improved more significantly.

When the polishing composition of the present disclosure is used, excellent polishing performance, more specifically, a high polishing rate with respect to an indium-containing polishing substrate may be exhibited, dispersibility of the composition may be improved, and residual defects on the substrate may be reduced.

What is claimed is:

1. A polishing composition comprising: anion-modified silica polishing particles comprising a compound formed on a surface by hydrolysis of at least one compound selected from the group consisting of polycarbonate, polysulfide, polyepoxide, and polyketone,
  a pH adjuster,
  wherein the anion-modified silica polishing particles have the zeta potential (ζ) of ≤−10 mV,
  wherein the polishing rate of an indium tin oxide (ITO) layer is from 2300 to 3700 Å/min,
  wherein the pH of the polishing composition is 4 to 6,
  wherein the anion-modified silica polishing particles are aluminum-modified silica polishing particles produced by mixing silica polishing particles with Al(OH)4−,
  wherein Al(OH)4− is mixed in an amount of 3% by weight based on the total weight of the aluminum-modified silica polishing particles, wherein the pH adjuster is included in an amount of 0.1 to 1% by weight based on the total weight of the polishing composition.

2. The polishing composition of claim 1, wherein the anion-modified silica polishing particles are colloidal silica.

3. The polishing composition of claim 1, wherein the anion-modified silica polishing particles have a zeta potential (ζ) of −25 mV to −10 mV.

4. A polishing method comprising:
  applying the polishing composition of claim 1 to a polishing substrate.

5. The polishing method of claim 4, wherein the application of the polishing composition to the polishing substrate is performed by at least one of a spray coating method, a spin coating method, a casting method, a tape casting method, a dip coating method, a bar coating method, a physical vapor deposition method, and a chemical vapor deposition method.

6. The polishing method of claim 4, wherein the polishing substrate includes an indium-containing layer.

7. The polishing method of claim 6, wherein the polishing substrate includes a layer containing an oxide of indium.

8. The polishing composition of claim 1, wherein at least some of silicon atoms of the silica polishing particles of the anion-modified silica polishing particles are substituted with a substitution metal comprising aluminum.

9. The polishing composition of claim 8, wherein the anion-modified silica polishing particles is produced by mixing the silica polishing particles with a precursor compound of the substitution metal.

10. The polishing composition of claim 9, wherein the substitution metal is one or more selected from the group consisting of metal oxides, organic metals, and metal salts of the substitution metal.

11. The polishing composition of claim 9, wherein the substitution metal is included in an amount of 0.001 to 10% by weight based on the total weight of the anion-modified silica polishing particles.

12. The polishing composition of claim 11, wherein the substitution metal is included in an amount of 0.3 to 2.5% by weight based on the total weight of the anion-modified silica polishing particles.

\* \* \* \* \*